US011800750B2

(12) United States Patent
Moon et al.

(10) Patent No.: US 11,800,750 B2
(45) Date of Patent: Oct. 24, 2023

(54) DISPLAY DEVICE HAVING MULTIPLE TRANSISTORS

(71) Applicant: LG Display Co., Ltd., Seoul (KR)

(72) Inventors: Kyeong Ju Moon, Paju-si (KR); So Young Noh, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 234 days.

(21) Appl. No.: 17/348,242

(22) Filed: Jun. 15, 2021

(65) Prior Publication Data

US 2022/0005904 A1    Jan. 6, 2022

(30) Foreign Application Priority Data

Jul. 6, 2020    (KR) .................. 10-2020-0082682

(51) Int. Cl.
  *H01L 27/14*    (2006.01)
  *H10K 59/121*   (2023.01)
  *H01L 29/786*   (2006.01)
  *H10K 59/131*   (2023.01)

(52) U.S. Cl.
  CPC ..... *H10K 59/1213* (2023.02); *H01L 29/7869* (2013.01); *H10K 59/131* (2023.02)

(58) Field of Classification Search
  CPC ............. H10K 59/1213; H10K 59/131; H10K 59/126; H10K 59/12; H10K 59/1216; H01L 29/7869; H01L 27/1255; H01L 27/1225; H01L 27/124; H01L 29/4908; H01L 29/78606; H01L 29/78633; H01L 29/42384; H01L 27/1214; H01L 27/3276; H01L 27/3272; H01L 27/3265; H01L 27/3262; H01L 27/3244

USPC ...................................................... 257/59, 72
See application file for complete search history.

(56) References Cited

U.S. PATENT DOCUMENTS

| 10,088,727 | B2 * | 10/2018 | Wada ................ H01L 29/42384 |
| 10,553,727 | B2   | 2/2020  | Bae et al. |
| 10,978,538 | B2 * | 4/2021  | Wang ................ H01L 29/78633 |
| 11,094,829 | B2 * | 8/2021  | Fang .................... H01L 29/4908 |
| 11,158,697 | B2 * | 10/2021 | Lee ..................... H10K 59/1216 |

(Continued)

FOREIGN PATENT DOCUMENTS

| CN | 204166873 U | * | 2/2015 |
| JP | 2000-269505 A |   | 9/2000 |

(Continued)

OTHER PUBLICATIONS

European Patent Office, Extended European Search Report and Opinion, EP Patent Application No. 21183674.7, dated Nov. 29, 2021, eight pages.

*Primary Examiner* — Tan N Tran

(74) *Attorney, Agent, or Firm* — Fenwick & West LLP

(57) ABSTRACT

Disclosed is a display device having improved reliability. The display device includes a first transistor disposed on a substrate, an electrical property of the first transistor being shifted from a first initial value in a decreasing direction; a second transistor disposed on the substrate, an electrical property of the second transistor being shifted from a second initial value in an increasing direction; and a first upper barrier conductive layer disposed so as to overlap a first active layer of the first transistor and not to overlap a second active layer of the second transistor, whereby reliability of each of the first and second transistors is improved.

21 Claims, 12 Drawing Sheets

(56) References Cited

U.S. PATENT DOCUMENTS

| | | |
|---|---|---|
| 11,271,015 B2 * | 3/2022 | Park .................. H10K 59/1213 |
| 2005/0173709 A1 | 8/2005 | Lee et al. |
| 2018/0122886 A1 | 5/2018 | Kim et al. |
| 2018/0190824 A1 | 7/2018 | Bae et al. |
| 2021/0126133 A1 | 4/2021 | Fang et al. |
| 2021/0202566 A1 | 7/2021 | Kim et al. |

FOREIGN PATENT DOCUMENTS

| | | |
|---|---|---|
| KR | 10-2018-0078837 A | 7/2018 |
| KR | 10-2021-0086342 A | 7/2021 |
| WO | WO 2020/015177 A1 | 1/2020 |

* cited by examiner

DISPLAY DEVICE HAVING MULTIPLE TRANSISTORS

CROSS-REFERENCE TO RELATED APPLICATION

This application claims the benefit of Korean Patent Application No. 10-2020-0082682, filed on Jul. 6, 2020, which is hereby incorporated by reference as if fully set forth herein.

BACKGROUND OF THE INVENTION

Field of the Invention

The present invention relates to a display device, and more particularly to a display device having improved reliability.

Discussion of the Related Art

In a display device, a thin film transistor (TFT) is used as a switching device and/or a driving device. Based on a material used as an active layer, the thin film transistor is classified as a thin film transistor using amorphous silicon, a thin film transistor using polysilicon, or a thin film transistor using an oxide semiconductor. Thereamong, the thin film transistor using the oxide semiconductor has higher mobility and less leakage current than the thin film transistor using the amorphous silicon.

When an oxide semiconductor layer is formed, however, oxygen defects occur due to separation of excess oxygen, and an excessive amount of hydrogen introduced into the oxide semiconductor layer increases carrier concentration of a channel region.

As a result, the electrical properties (e.g. threshold voltage) of the thin film transistor are changed, whereby reliability of the thin film transistor is deteriorated.

SUMMARY OF THE INVENTION

Accordingly, the present invention is directed to a display device that substantially obviates one or more problems due to limitations and disadvantages of the related art.

It is an object of the present invention to provide a display device having improved reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in one aspect, a display device includes a barrier conductive layer disposed so as to overlap a first active layer of a first transistor, the electrical property of which is shifted from an initial value in a decreasing direction, and not to overlap a second active layer of a second transistor, the electrical property of which is shifted from an initial value in an increasing direction, whereby reliability of each of the first and second transistors is improved.

The first transistor may include a first gate electrode configured to overlap the first active layer, and a first upper barrier conductive layer may be disposed on the first gate electrode so as to expose the side surface of the first gate electrode.

The second transistor may include a second gate electrode configured to overlap the second active layer, the second gate electrode being formed of an identical material to the first gate electrode.

The first upper barrier conductive layer may be formed so as to have a single-layered or multilayered structure using a hydride forming metal comprising at least one of Ti and Zr, and each of the first and second gate electrodes may be formed so as to have a single-layered or multilayered structure using a non-hydride forming metal comprising at least one of Mo, Cu, Al, and W.

The display device may further include a first shading layer disposed between the first active layer of the first transistor and a substrate, a second shading layer disposed between the second active layer of the second transistor and the substrate, and a lower barrier conductive layer disposed between the first shading layer and the first active layer so as to overlap the first shading layer and not to overlap the second shading layer.

The display device may further include a storage electrode configured to overlap the second gate electrode via a storage dielectric film so as to form a storage capacitor, an interlayer conductive layer configured to overlap the first gate electrode via the storage dielectric film, and a second upper barrier conductive layer disposed on the interlayer conductive layer so as to overlap the interlayer conductive layer and not to overlap the storage electrode.

In another aspect, a display device comprising: a first transistor disposed on a substrate, an electrical property of the first transistor being shifted from a first initial value in a decreasing direction; a second transistor disposed on the substrate, an electrical property of the second transistor being shifted from a second initial value in an increasing direction; and a first upper barrier conductive layer disposed so as to overlap a first active layer of the first transistor and not to overlap a second active layer of the second transistor.

In still another aspect, display device comprising: a switching transistor disposed on a substrate, the switching transistor comprising a first active layer formed of an oxide semiconductor layer; a driving transistor electrically connected to the switching transistor, the driving transistor comprising a second active layer formed of an identical material to the first active layer; a light-emitting device electrically connected to the driving transistor; and a first upper barrier conductive layer disposed so as to overlap the first active layer of the switching transistor and not to overlap the second active layer of the driving transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

Figure 1:
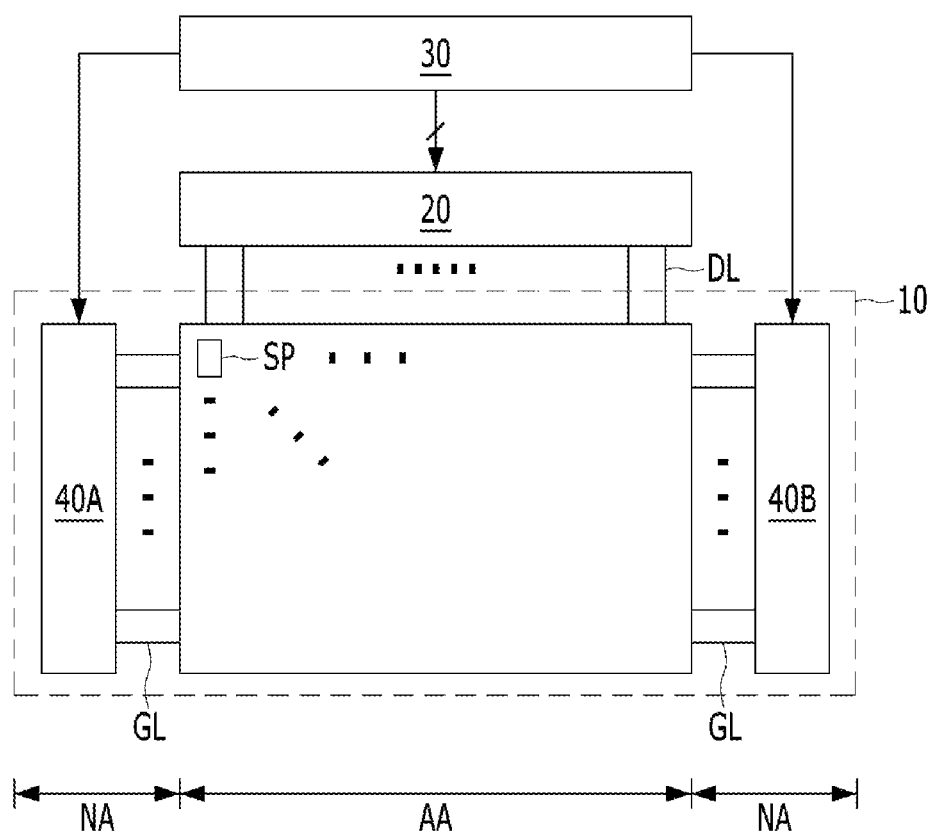
FIG. 1 is a block diagram of a display device according to the present invention.
Figure 2:
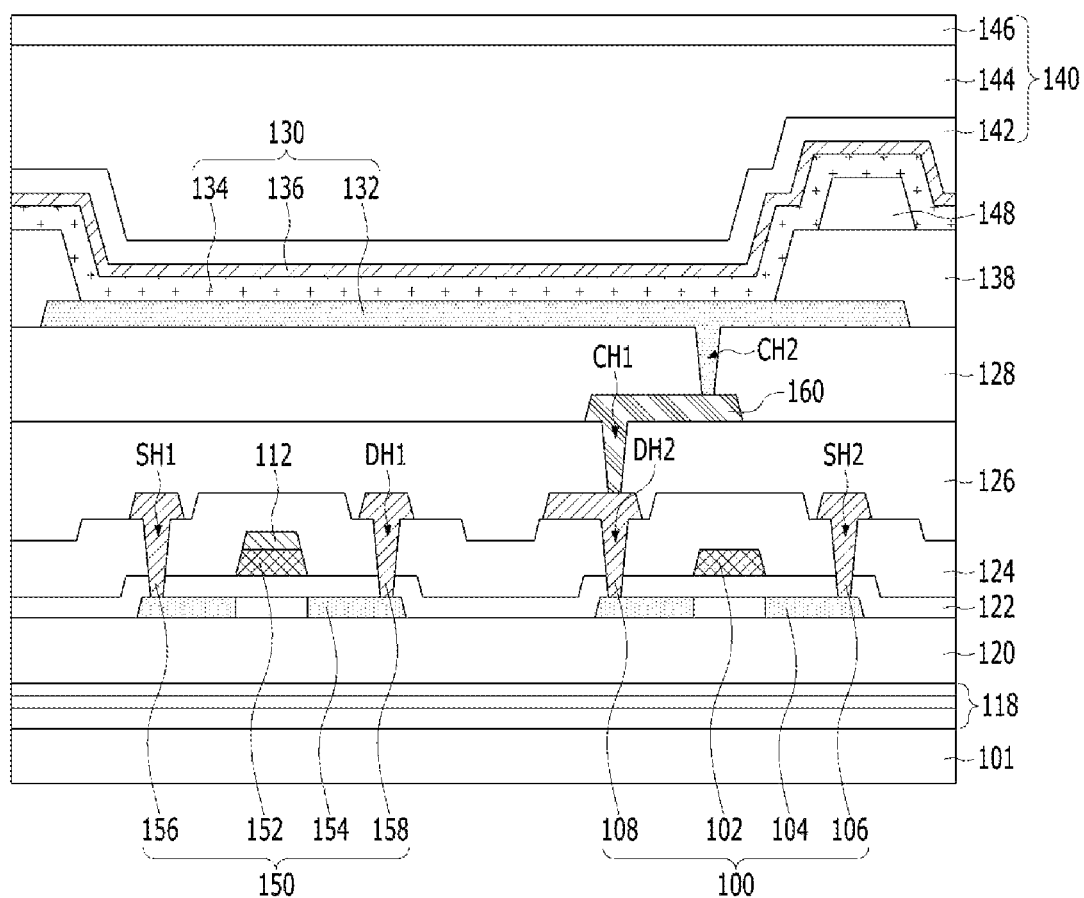
FIG. 2 is a sectional view of the display device shown in FIG. 1.
Figure 3:
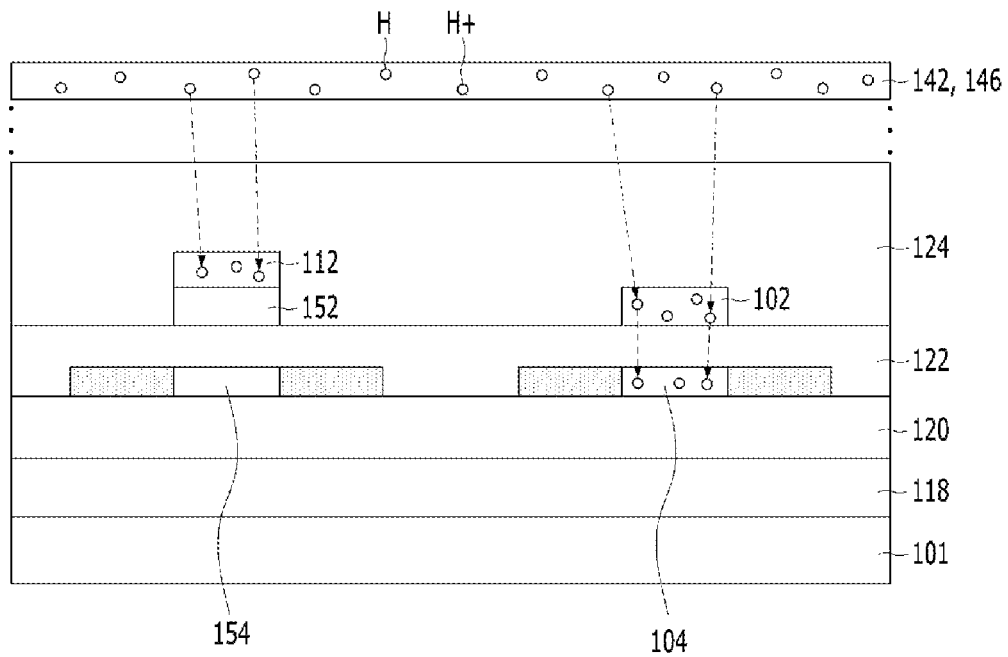
FIG. 3 is a view illustrating a process in which hydrogen moves from an inorganic encapsulation layer shown in FIG. 2.
Figure 4A:
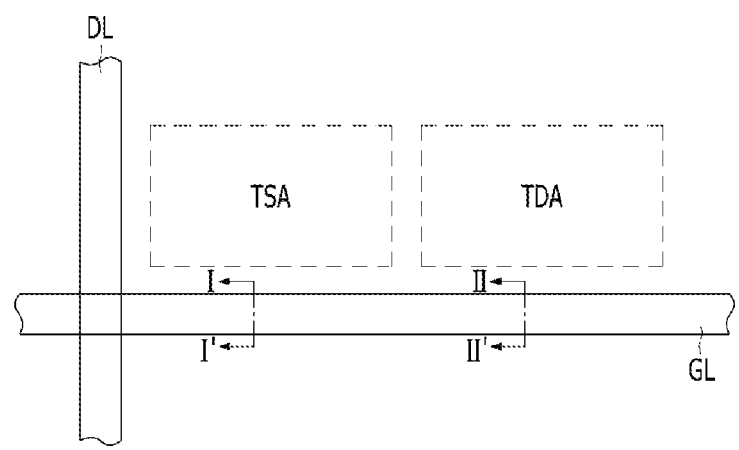
FIGS. 4A and 4B are respectively a plan view and a sectional view of a gate line disposed in the vicinity of a switching transistor and a driving transistor shown in FIG. 2.
Figure 4B:
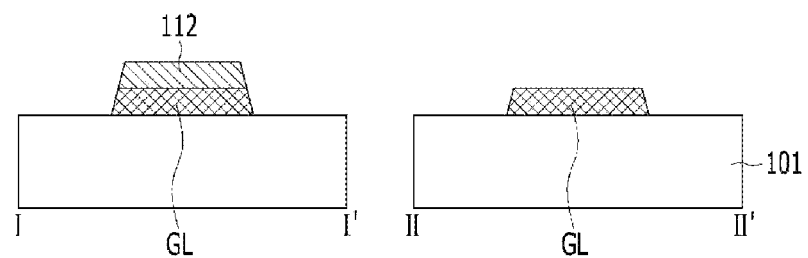

FIG. 1 is a block diagram of an organic light-emitting display device according to the present invention. FIG. 2 is a sectional view of the display device shown in FIG. 1. FIG. 3 is a view illustrating a process in which hydrogen moves from an inorganic encapsulation layer shown in FIG. 2. FIG. 4A is a plan view of a gate line disposed in the vicinity of a switching transistor and a driving transistor shown in FIG. 2 and FIG. 4B is a sectional view taken along Line I-I' and Line II-II' of FIG. 4A.

The organic light-emitting display device shown in FIG. 1 includes an organic light-emitting display panel 10 and a panel driving unit configured to drive the organic light-emitting display panel 10. The panel driving unit includes a data driving unit 20, gate driving units 40A and 40B, and a timing controller 30.

The timing controller 30 generates data control signals and gate control signals for controlling driving timing of the data driving unit 20 and the gate driving units 40A and 40B and supplies the data control signals and gate control signals to the data driving unit 20 and the gate driving units 40A and 40B. The timing controller 30 processes image data and supplies the image data to the data driving unit 20.

The data driving unit 20 is controlled by the data control signal supplied from the timing controller 30, and converts the image data supplied from the timing controller 30 into an analog data signal and supplies the same to data lines DL of the display panel 10.

Each of the gate driving units 40A and 40B is realized by a gate in panel (GIP) circuit directly formed in a non-active area NA on the organic light-emitting display panel 10 in the form of a thin film transistor. The gate driving units 40A and 40B are disposed in the non-active area NA of at least one of the left and right sides of the organic light-emitting display panel 10.

Each of the gate driving units 40A and 40B outputs a gate signal while shifting the level of gate voltage in response to the gate control signal supplied from the timing controller 30. Each of the gate driving units 40A and 40B outputs a gate signal through gate lines GL.

The organic light-emitting display panel 10 includes an active area AA configured to realize a screen on which an input image is displayed and a non-active area NA disposed on at least one side of the active area AA.

The non-active area NA is an area in which no input image is displayed. No subpixels SP are disposed in the non-active area NA, and signal lines and the gate driving units 40A and 40B are disposed in the non-active area NA.

In the active area AA, subpixels SP connected to the data lines DL and the gate lines GL, which intersect each other, are disposed in a matrix form. As shown in FIG. 2, each of the subpixels SP includes a light-emitting device 130 and at least one driving transistor 100 and at least one switching transistor 150 electrically connected to the light-emitting device 130.

The switching transistor 150 switches data voltage that is written in each subpixel SP located in the active area AA. As shown in FIG. 2, the switching transistor 150 includes a first active layer 154, a first gate electrode 152, a first source electrode 156, and a first drain electrode 158.

The first active layer 154 is formed on a lower buffer layer 120 so as to overlap the first gate electrode 152 in order to form a channel between a first source region and a first drain region. The first active layer 154 is formed of an oxide semiconductor. A multi-buffer layer 118 and the lower buffer layer 120 are disposed between the first active layer 154 and a substrate 101. The multi-buffer layer 118 retards spread of moisture and/or oxygen that permeated the substrate 101. The multi-buffer layer 118 is formed as a result of silicon nitride (SiNx) and silicon oxide (SiOx) being alternately stacked at least once. The lower buffer layer 120 protects the first active layer 154, and blocks various kinds of defects introduced from the substrate 101. The lower buffer layer 120 may be formed of a-Si, silicon nitride (SiNx), or silicon oxide (SiOx).

The first gate electrode 152 is electrically connected to the gate line GL, and overlaps the channel of the first active layer 154 via a gate dielectric film 122.

The first source electrode 156 is disposed on an interlayer dielectric film 124 so as to be electrically connected to the data line DL. The first source electrode 156 contacts the first source region of the first active layer 154 exposed through a first source contact hole SH1 formed through the gate dielectric film 122 and the interlayer dielectric film 124.

The first drain electrode 158 is disposed on the interlayer dielectric film 124 so as to be electrically connected to a second gate electrode 102 of the driving transistor 100. The first drain electrode 158 contacts first drain region of the first active layer 154 exposed through a first drain contact hole DH1 formed through the gate dielectric film 122 and the interlayer dielectric film 124.

The driving transistor 100 is operated such that driving current flows between a high-voltage supply line and a low-voltage supply line depending on data voltage stored in a storage capacitor. As shown in FIG. 2, the driving transistor 100 includes a second gate electrode 102 electrically connected to the first drain electrode 158 of the switching transistor 150, a second source electrode 106 connected to the high-voltage supply line, a second drain electrode 108 connected to the light-emitting device 130, and a second active layer 104 configured to form a channel between a second source region and a second drain region.

The second active layer 104 is formed on the lower buffer layer 120 so as to overlap the second gate electrode 102 in order to form a channel between the second source region and the second drain region. The second active layer 104 is formed of the same material as the first active layer 154, i.e. an oxide semiconductor.

The second gate electrode 102 is electrically connected to the gate line GL, and overlaps the channel of the second active layer 104 via the gate dielectric film 122.

The second source electrode 106 is disposed on the interlayer dielectric film 124 so as to be electrically connected to the data line DL. The second source electrode 106 contacts the second source region of the second active layer 104 exposed through a second source contact hole SH2 formed through the gate dielectric film 122 and the interlayer dielectric film 124.

The second drain electrode 108 is disposed on the interlayer dielectric film 124. The second drain electrode 108 contacts the second drain region of the second active layer 104 exposed through a second drain contact hole DH2 formed through the gate dielectric film 122 and the interlayer dielectric film 124.

The light-emitting device 130 includes an anode 132, a cathode 136, and a light-emitting stack 134 formed between the anode 132 and the cathode 136.

The anode 132 is disposed on a second planarization layer 128 so as to be independent for each subpixel. The anode 132 is connected to a pixel connection electrode 160 exposed through a second pixel contact hole CH2 formed through the second planarization layer 128. Here, the pixel connection electrode 160 is disposed on a first planarization layer 126 and is connected to the second drain electrode 108 exposed through a first pixel contact hole CH1 formed through the first planarization layer 126.

The anode 132 is disposed on the second planarization layer 128 so as to overlap at least one of the driving and switching transistors 100 and 150 as well as a light-emitting region provided by a bank 138, whereby light emission area is increased.

The bank 138 is formed so as to expose the anode 132, whereby the light-emitting region is provided. The bank 138 is formed in the active area while being formed of an opaque (e.g. black) material so as to prevent light interference between adjacent subpixels, or is formed in the non-active area NA as well as the active area AA so as to overlap the gate driving units 40A and 40B. In this case, the bank 138 includes a shading material constituted by at least one of color pigment, organic black material, and carbon.

The light-emitting stack 134 is formed as the result of a hole-related layer, an organic emissive layer, and an electron-related layer being stacked on the anode 132 in that order or in the reverse order. The light-emitting stack 134 is formed through a manufacturing process using a fine metal mask (FMM). At this time, in order to prevent damage to the light-emitting stack 134 and/or the bank 138 due to the fine metal mask (FMM), a spacer 148 is disposed on the bank 138. The spacer 148 is formed of an organic dielectric material, in the same manner as the bank 138 and the first and second planarization layers 126 and 128.

The cathode 136 is formed on the upper surface and the side surface of the light-emitting stack 134 so as to be opposite the anode 132 via the light-emitting stack 134. The cathode 136 is formed so as to be shared by all of the subpixels disposed in the active area AA. An encapsulation unit 140 is disposed on the substrate 101 having the cathode 136 formed thereon.

The encapsulation unit 140 prevents external moisture or oxygen from permeating the light-emitting device 130, which has low resistance to external moisture or oxygen. To this end, the encapsulation unit 140 includes a plurality of inorganic encapsulation layers 142 and 146 and an organic encapsulation layer 144 disposed between the plurality of inorganic encapsulation layers 142 and 146. The inorganic encapsulation layer 146 is disposed as the uppermost layer. At this time, the encapsulation unit 140 includes at least two inorganic encapsulation layers 142 and 146 and at least one organic encapsulation layer 144. Hereinafter, an encapsulation unit 140 having a structure in which an organic encapsulation layer 144 is disposed between first and second inorganic encapsulation layers 142 and 146 will be described by way of example.

The organic encapsulation layer 144 is disposed between the inorganic encapsulation layers 142 and 146 to reduce stress between respective layers due to bending of a substrate 101 of a bendable display device. That is, the organic encapsulation layer 144 serves as a shock absorber. In addition, the organic encapsulation layer 144 strengthens planarization performance. The organic encapsulation layer 144 is formed of an organic dielectric material, such as an acrylic resin, an epoxy resin, polyimide, polyethylene, or silicon oxycarbide (SiOC).

The first inorganic encapsulation layer 142 is formed on the substrate 101 having the cathode 136 formed thereon so as to be closest to the light-emitting device 130. The first inorganic encapsulation layer 142 is formed of an inorganic dielectric material capable of being deposited at low temperature, such as silicon nitride (SiNx), silicon oxide (SiOx), silicon oxynitride (SiON), or aluminum oxide ($Al_2O_3$). Consequently, the first inorganic encapsulation layer 142 is deposited in a low-temperature atmosphere, whereby it is possible to prevent damage to the light-emitting stack 134, which has low resistance to a high-temperature atmosphere, in a process of depositing the first inorganic encapsulation layer 142.

The second inorganic encapsulation layer 146 is formed on the substrate 101 having the organic encapsulation layer 144 formed thereon so as to cover the upper surface and the side surface of each of the organic encapsulation layer 144 and the first inorganic encapsulation layer 142. Consequently, the second inorganic encapsulation layer 146 minimizes or prevents external moisture or oxygen from permeating the first inorganic encapsulation layer 142 and the organic encapsulation layer 144. The second inorganic encapsulation layer 146 is formed of an inorganic dielectric material, such as silicon nitride (SiNx), silicon oxide (SiOx), silicon oxynitride (SiON), or aluminum oxide ($Al_2O_3$).

Hydrogen spread from the first and second inorganic encapsulation layers 142 and 146 is bonded with excess oxygen from a transistor to which positive bias temperature stress (hereinafter referred to "PBTS") is applied, whereby reliability of a transistor to which PBTS is applied is improved. However, hydrogen spread from the first and second inorganic encapsulation layers 142 and 146 increases carrier concentration of a transistor to which negative bias temperature stress (hereinafter referred to "NBTS") is applied, which causes NBTS deterioration.

In the present invention, therefore, a first upper barrier conductive layer 112 capable of adsorbing hydrogen is selectively disposed at a transistor to which NBTS is applied in order to prevent NBTS deterioration. For a transistor having a relatively short driven time, threshold voltage is shifted from an initial value in a negative (−) direction, whereby NBTS is applied thereto. For a transistor having a relatively long driven time, on the other hand, an electrical property (e.g. threshold voltage) is shifted from an initial value in a positive (+) direction, whereby PBTS is applied thereto.

Specifically, in the present invention, the driving transistor 100 shown in FIG. 2 is a device to which PBTS is applied, and the switching transistor 150 is a device to which NBTS is applied. However, this is merely an example, and therefore the present invention is not limited thereto. The driving transistor 100 may be a device to which NBTS is applied, and the switching transistor 150 may be a device to which PBTS is applied.

A first upper barrier conductive layer 112 is disposed above the first active layer 154 of the switching transistor 150, which is a device in which NBTS is accumulated. The first upper barrier conductive layer 112 is formed on the first gate electrode 152 so as to have the same line width as the first gate electrode 152 in order to expose the side surface of the first gate electrode 152. To this end, the first upper barrier conductive layer 112 is formed together with the first and second gate electrodes 152 and 102 through a manufacturing process using the same mask as the first and second gate electrodes 152 and 102. For example, the first upper barrier conductive layer 112 is formed together with the first and second gate electrodes 152 and 102 through a manufacturing process using a half-tone mask.

The first upper barrier conductive layer 112 is formed so as to have a single-layered or multilayered structure using a hydride forming metal including at least one of Ti and Zr. As shown in FIG. 3, the hydride forming metal in the first upper barrier conductive layer 112 is stably bonded with hydrogen (H) spread from the first and second inorganic encapsulation layers 142 and 146 to the first active layer 154, whereby hydrogen (H) spread from the first and second inorganic encapsulation layers 142 and 146 is adsorbed into the first upper barrier conductive layer 112. Consequently, the concentration of hydrogen in the vicinity of the first active layer 154 is reduced, whereby it is possible to prevent carrier concentration of the channel of the first active layer 154 from being increased by hydrogen. As a result, it is possible to prevent acceleration in NBTS deterioration of the switching transistor 150, whereby reliability of the switching transistor 150 is improved.

The first upper barrier conductive layer 112 is not disposed on the second gate electrode 102 of the driving transistor 100, which is a device in which PBTS is accumulated, whereby the upper surface of the second gate electrode 102 of the driving transistor 100 contacts the interlayer dielectric film 124. At this time, the second gate electrode 102 is formed so as to have a single-layered or multilayered structure using a non-hydride forming metal including at least one of Mo, Cu, Al, and W, in the same manner as the first gate electrode 152. Hydrogen from the first and second inorganic encapsulation layers 142 and 146 is spread into the second active layer 104 through the second gate electrode 102 and is bonded with excess oxygen in the second active layer 104. As a result, the amount of excess oxygen in the second active layer 104 is reduced, whereby defect state passivation is achieved and thus reliability of the driving transistor 100 is improved.

Meanwhile, the first upper barrier conductive layer 112 may be disposed on a signal line disposed in the vicinity of the switching and driving transistors 150 and 100. Specifically, as shown in FIGS. 4A and 4B, the first upper barrier conductive layer 112 is disposed on a gate line GL corresponding to an area TSA in which the switching transistor 150 is disposed. The first upper barrier conductive layer 112 disposed on the gate line GL reduces the concentration of hydrogen in the vicinity of the switching transistor 150, whereby it is possible to prevent carrier concentration of the channel of the first active layer 154 from being increased by hydrogen. As a result, it is possible to prevent acceleration in NBTS deterioration of the switching transistor 150, whereby reliability of the switching transistor 150 is improved.

The first upper barrier conductive layer 112 is not disposed on a gate line GL corresponding to an area TDA in which the driving transistor 100 is disposed. Consequently, the concentration of hydrogen in the vicinity of the driving transistor 100 is not changed, whereby hydrogen is bonded with excess oxygen in the second active layer 104 of the driving transistor 100 disposed in the vicinity of the gate line GL. As a result, the amount of excess oxygen in the second active layer 104 is reduced, whereby defect state passivation is achieved and thus reliability of the driving transistor 100 is improved.

Figure 5:
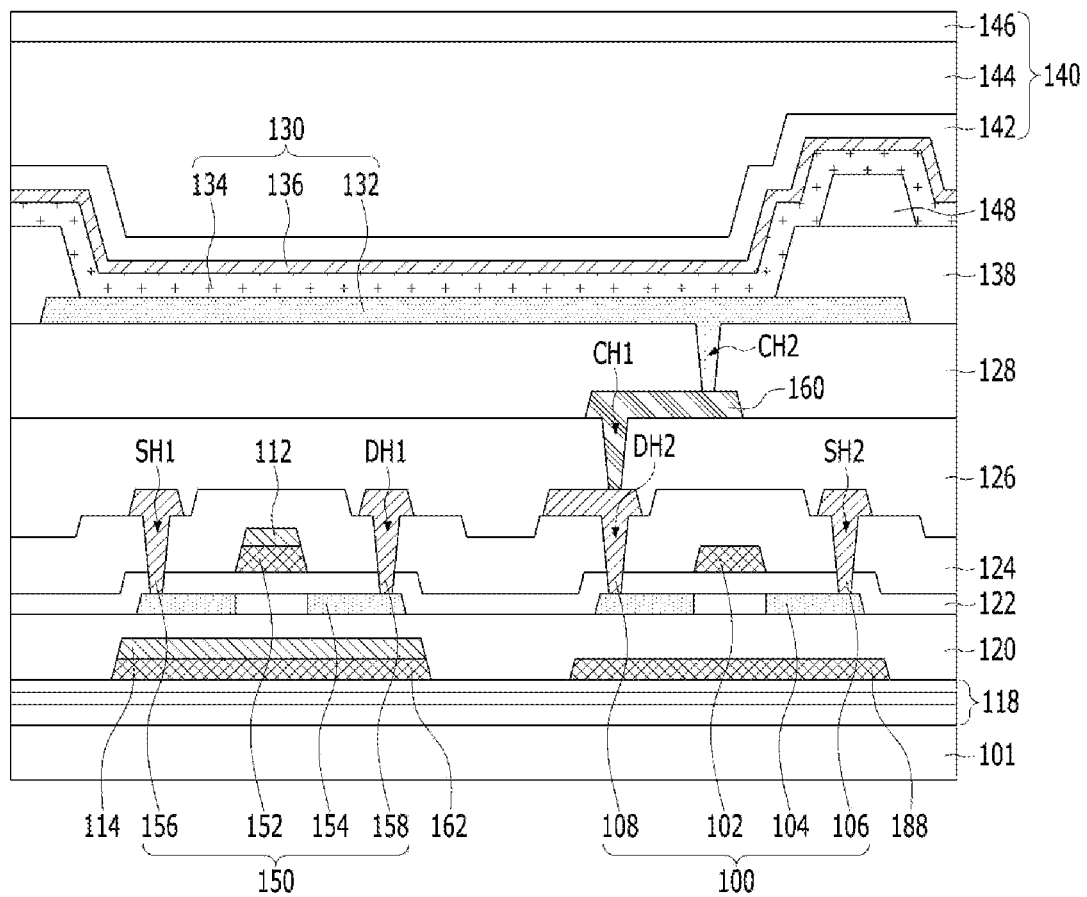
FIG. 5 is a sectional view of a display device according to a second embodiment of the present invention.

FIG. 5 is a sectional view of an organic light-emitting display device according to a second embodiment of the present invention. The organic light-emitting display device shown in FIG. 5 is identical in construction to the organic light-emitting display device shown in FIG. 2 except that first and second shading layers 162 and 188 and a lower barrier conductive layer 114 are further included. Consequently, a detailed description of the same components will be omitted.

The first shading layer 162 is disposed on a multi-buffer layer 118 between a substrate 101 and a first active layer 154 so as to overlap the first active layer 154. The second shading layer 188 is disposed on the multi-buffer layer 118 between the substrate 101 and a second active layer 104 so as to overlap the second active layer 104.

Each of the first and second shading layers 162 and 188 absorbs or reflects light incident from the rear surface of the substrate 101, whereby it is possible to block or minimize light that is incident upon a channel of each of the first and second active layers 154 and 104. Each of the first and second shading layers 162 and 188 is formed so as to have a single-layered or multilayered structure using a non-hydride forming metal including at least one of Mo, Cu, Al, and W.

The lower barrier conductive layer 114 is disposed between the first active layer 154 and the first shading layer 162 so as to be disposed under the first active layer 154. The lower barrier conductive layer 114 is formed on the first shading layer 162 so as to have the same line width as the first shading layer 162 in order to expose the side surface of the first shading layer 162. To this end, the lower barrier conductive layer 114 is formed together with the first and second shading layers 162 and 188 through a manufacturing process using the same mask as the first and second shading layers 162 and 188. For example, the lower barrier conductive layer 114 is formed together with the first and second shading layers 162 and 188 through a manufacturing process using a half-tone mask.

Figure 6:
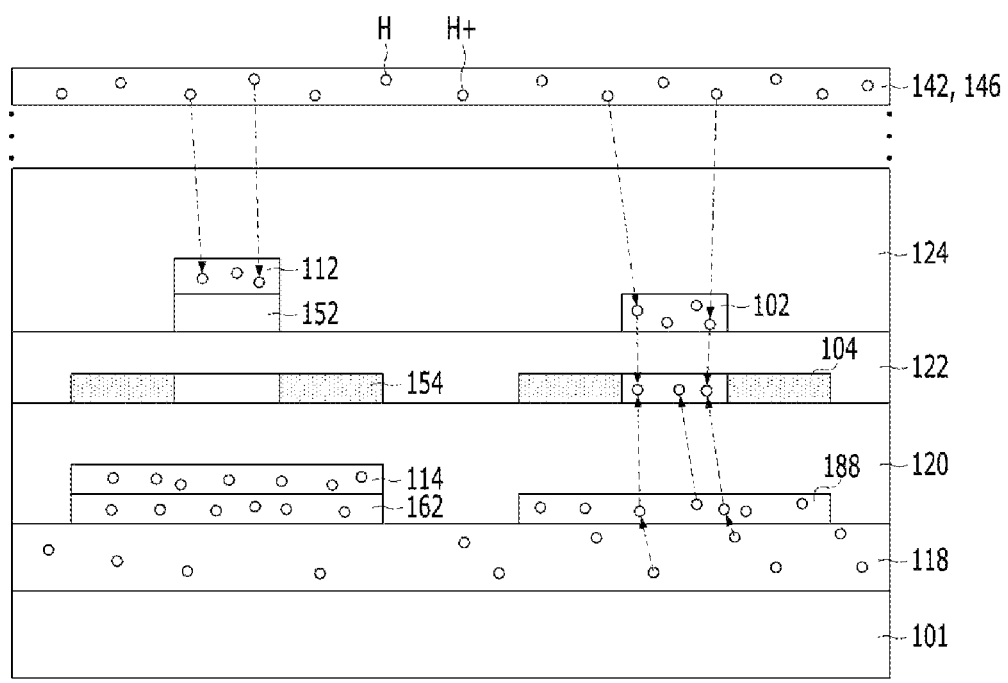
FIG. 6 is a view illustrating a process in which hydrogen moves from an inorganic encapsulation layer and a multi-buffer layer shown in FIG. 5.

The lower barrier conductive layer 114 is formed so as to have a single-layered or multilayered structure using a hydride forming metal including at least one of Ti and Zr, in the same manner as the first upper barrier conductive layer 112. The hydride forming metal in the lower barrier conductive layer 114 is stably bonded with hydrogen spread from the multi-buffer layer 118 to the first active layer 154, whereby hydrogen spread from the multi-buffer layer 118 is adsorbed into the lower barrier conductive layer 114, as shown in FIG. 6. Consequently, the concentration of hydrogen in the vicinity of the first active layer 154 is reduced, whereby it is possible to prevent carrier concentration of a channel of the first active layer 154 from being increased by hydrogen. As a result, it is possible to prevent acceleration in NBTS deterioration of a switching transistor 150, whereby reliability of the switching transistor 150 is improved.

The lower barrier conductive layer 114 is not disposed under a second active layer 104 of a driving transistor 100, which is a device to which PBTS is applied. Consequently, hydrogen from the multi-buffer layer 118 is spread into the second active layer 104 through the second shading layer 188 having the non-hydride forming metal and is bonded with excess oxygen in the second active layer 104. As a result, the amount of excess oxygen in the second active layer 104 is reduced, whereby defect state passivation is achieved and thus reliability of the driving transistor 100 is improved.

Figure 7:
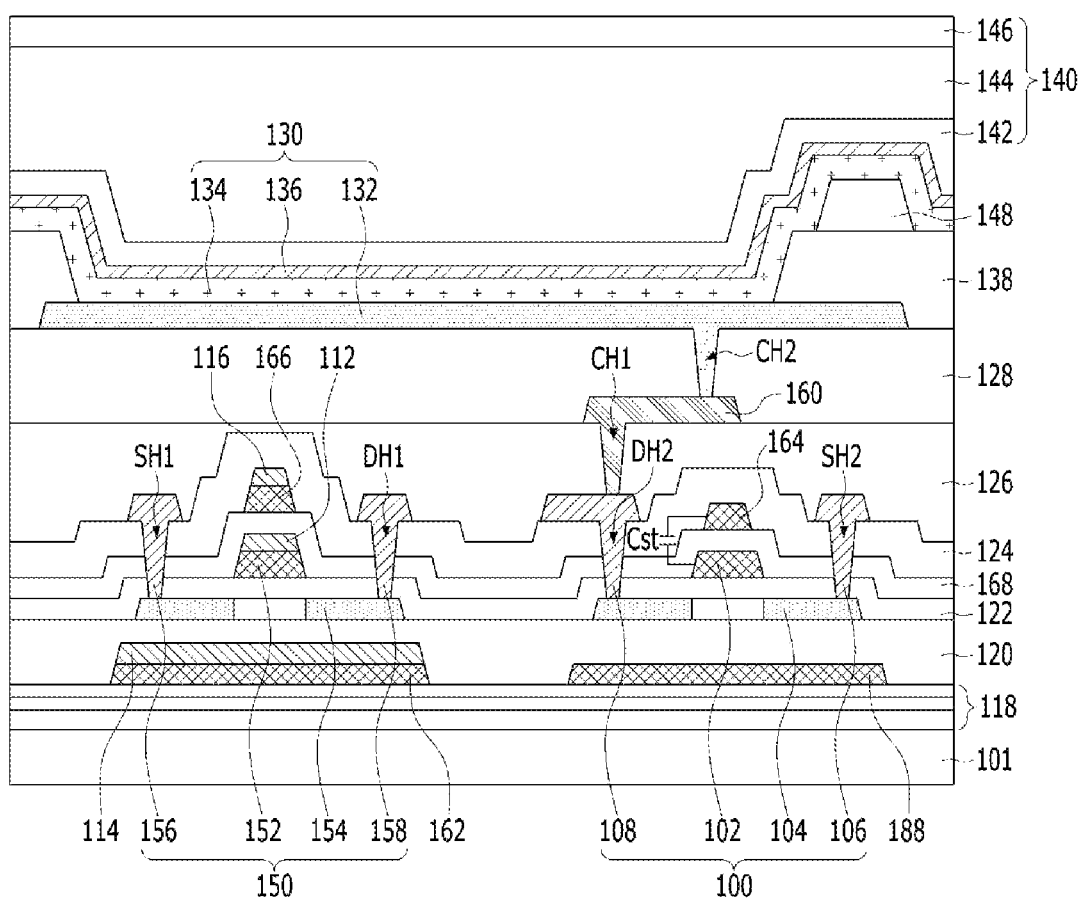
FIG. 7 is a sectional view of a display device according to a third embodiment of the present invention.

FIG. 7 is a sectional view of an organic light-emitting display device according to a third embodiment of the present invention. The organic light-emitting display device shown in FIG. 7 is identical in construction to the organic light-emitting display device shown in FIG. 5 except that a second upper barrier conductive layer 116, an interlayer conductive layer 166, and a storage electrode 164 are further included. Consequently, a detailed description of the same components will be omitted.

The interlayer conductive layer 166 overlaps a first gate electrode 152 of a switching transistor 150 via a storage dielectric film 168. The interlayer conductive layer 166 is maintained in an electrical floating state. The interlayer conductive layer 166 maintained in the floating state does not serve as a signal line that transmits a signal or an electrode.

The storage electrode 164 overlaps a second gate electrode 102 of a driving transistor 100 via the storage dielectric film 168 to form a storage capacitor Cst. Since the storage capacitor Cst overlaps the driving transistor 100, no separate space is necessary to form the storage capacitor Cst, whereby high definition and high resolution are realized.

Each of the interlayer conductive layer 166 and the storage electrode 164 is formed so as to have a single-layered or multilayered structure using a non-hydride forming metal including at least one of Mo, Cu, Al, and W.

The second upper barrier conductive layer 116 is disposed on the storage dielectric film 168 so as to be disposed above a first active layer 154. The second upper barrier conductive layer 116 is formed on the interlayer conductive layer 166 so as to have the same line width as the interlayer conductive layer 166 in order to expose the side surface of the interlayer conductive layer 166. To this end, the second upper barrier conductive layer 116 is formed together with the interlayer conductive layer 166 and the storage electrode 164 through a manufacturing process using the same mask as the interlayer conductive layer 166 and the storage electrode 164. For example, the second upper barrier conductive layer 116 is formed together with the interlayer conductive layer 166 and the storage electrode 164 through a manufacturing process using a half-tone mask.

The second upper barrier conductive layer 116 is formed so as to have a single-layered or multilayered structure using a hydride forming metal including at least one of Ti and Zr, in the same manner as the first upper barrier conductive layer 112. The hydride forming metal in the second upper barrier conductive layer 116 is stably bonded with hydrogen (H) spread from first and second inorganic encapsulation layers 142 and 146 to the first active layer 154, whereby hydrogen (H) spread from the first and second inorganic encapsulation layers 142 and 146 is adsorbed into the second upper barrier conductive layer 116. Consequently, the concentration of hydrogen in the vicinity of the first active layer 154 is reduced, whereby it is possible to prevent carrier concentration of a channel of the first active layer 154 from being increased by hydrogen. As a result, it is possible to prevent acceleration in NBTS deterioration of the switching transistor 150, whereby reliability of the switching transistor 150 is improved.

The second upper barrier conductive layer 116 is not disposed above a second active layer 104 of the driving transistor 100, which is a device to which PBTS is applied. Consequently, hydrogen from the first and second inorganic encapsulation layers 142 and 146 is spread into the second active layer 104 through the storage electrode 164 having the non-hydride forming metal and is bonded with excess oxygen in the second active layer 104. As a result, the amount of excess oxygen in the second active layer 104 is reduced, whereby defect state passivation is achieved and thus reliability of the driving transistor 100 is improved.

Meanwhile, in FIG. 7, first and second upper barrier conductive layers 112 and 116 and a lower barrier conductive layer 114 are all disposed on a substrate 101. However, this is merely an example, and therefore the present invention is not limited thereto. That is, at least one of the first and second upper barrier conductive layers 112 and 116 and the lower barrier conductive layer 114 may be disposed on the substrate 101, as shown in FIGS. 2 and 5.

At least one of the first and second upper barrier conductive layers 112 and 116 and the lower barrier conductive layer 114 may be applied to each of the gate driving units 40A and 40B shown in FIG. 1 as well as the subpixel SP.

Figure 8:
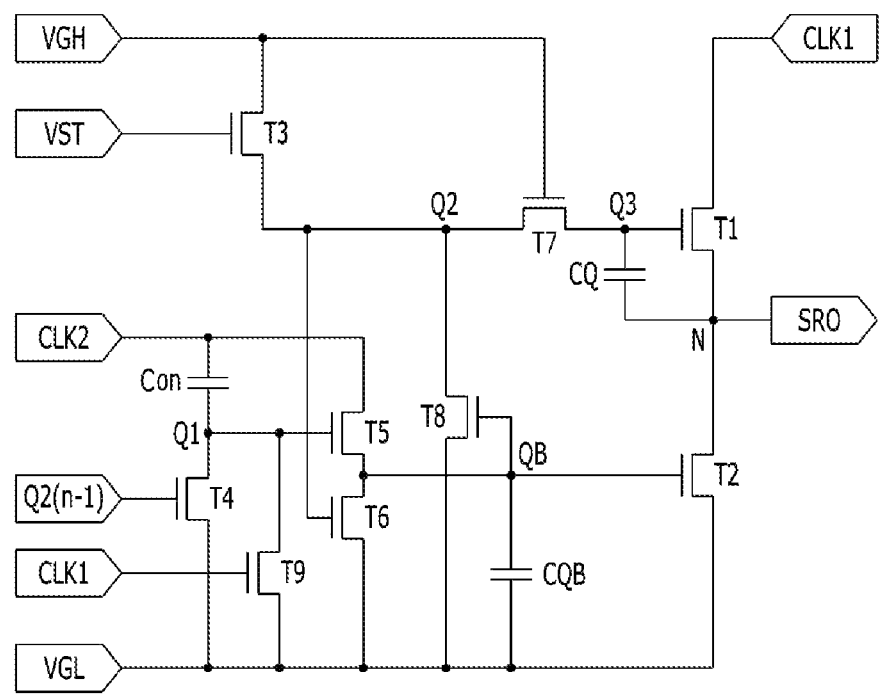
FIG. 8 is a circuit diagram of a gate driving unit shown in FIG. 1.

As shown in FIG. 8, each of the gate driving units 40A and 40B includes a plurality of transistors T1 to T9 and capacitors Con, CQ, and CQB. Meanwhile, each of the gate driving units 40A and 40B is not limited to the structure shown in FIG. 8 and is variously changeable.

The transistor T1 is an output buffer, the operation of which is controlled depending on the electrical potential of a node Q3. In the case in which the node Q3 is activated so as to have high-level gate voltage VGH, the transistor T1 outputs a scan signal SRO of the high-level gate voltage VGH to a node N. The transistor T2 is an output buffer, the operation of which is controlled depending on the electrical potential of a node QB. In the case in which the node QB is activated so as to have low-level gate voltage VGL, the transistor T2 outputs a scan signal SRO of the low-level gate voltage VGL to the node N. The transistor T3 is switched according to a start signal VST to supply the high-level gate voltage VGH to a node Q2. The transistor T4 is switched according to a front end carry signal Q2(n−1) to apply the low-level gate voltage VGL to a node Q1. The transistor T5 is switched according to the voltage of the node Q1 to supply a second clock signal CLK2 to the node QB. The transistor T6 is switched according to the voltage of the node Q2 to supply the low-level gate voltage VGL to the node QB. The transistor T7 is an auxiliary transistor that remains on due to the high-level gate voltage VGH. The transistor T7 keeps voltages of the node Q2 and the node Q3 substantially equal to each other. The transistor T8 is switched according to the voltage of the node QB to apply the low-level gate voltage VGL to the node Q2. The transistor T9 is switched according to a first clock signal CLK1 to apply the low-level gate voltage VGL to the node Q1. The capacitor Con is a coupling capacitor connected between an input end of the second clock signal CLK2 and the node Q1, the capacitor CQ is connected between the node Q3 and the node N to store the voltage of the node Q3, and the capacitor CQB is connected between the node QB and an input end of the low-level gate voltage VGL to store the voltage of the node QB.

At least one of the plurality of transistors T1 to T9 included in each of the gate driving units 40A and 40B is a device in which NBTS is accumulated, and the others of the plurality of transistors T1 to T9 are devices in each of which PBTS is accumulated.

For example, a second circuit transistor TB including at least one of the transistors T5, T6, and T8 connected to the node QB is a device in which PBTS is accumulated, and a first circuit transistor TA including at least one of the other transistors T1, T2, T3, T4, T7, and T9 is a device in which NBTS is accumulated.

Figure 9:
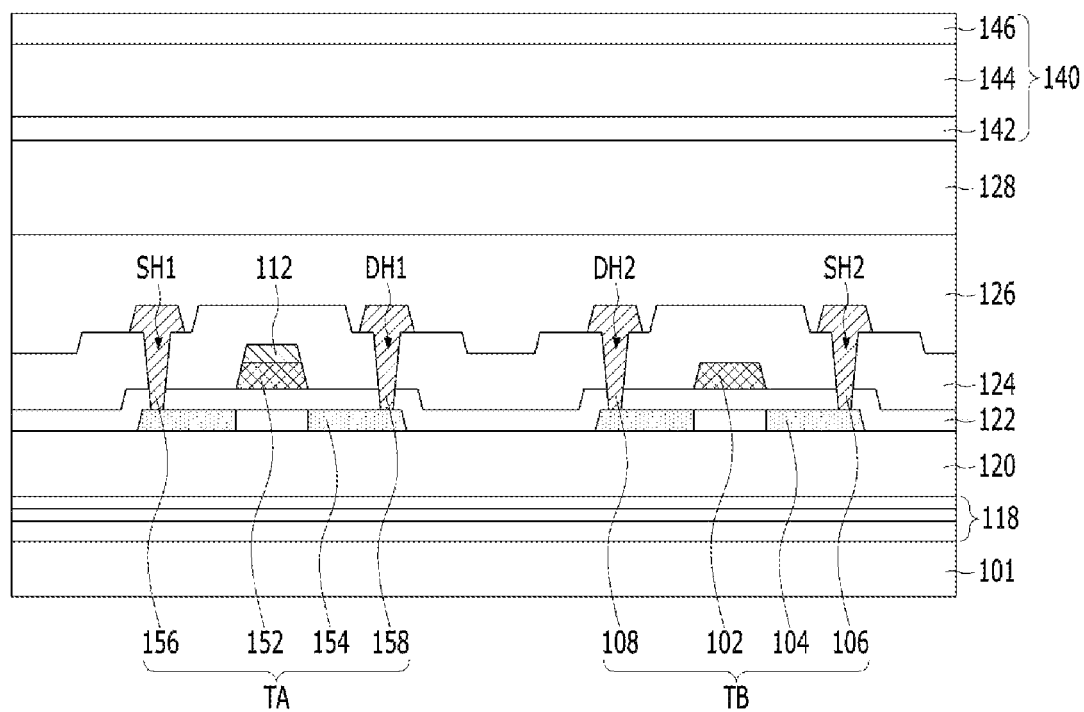
FIG. 9 is a sectional view of a first embodiment of the gate driving unit shown in FIG. 8.

Consequently, as shown in FIG. 9, a first active layer 154 of the first circuit transistor TA overlaps at least one of first and second upper barrier conductive layers 112 and 116 and a lower barrier conductive layer 114, and a second active layer 104 of the second circuit transistor TB does not overlap at least one of the first and second upper barrier conductive layers 112 and 116 and the lower barrier conductive layer 114.

Consequently, hydrogen (H) spread from at least one of first and second inorganic encapsulation layers 142 and 146 and a multi-buffer layer 118 is adsorbed into the barrier conductive layers 112, 114, and 116 disposed in the first circuit transistor TA. The concentration of hydrogen in the vicinity of the first active layer 154 of the first circuit transistor TA is reduced by hydrogen adsorption, whereby it is possible to prevent carrier concentration of the channel of the first active layer 154 from being increased by hydrogen. As a result, it is possible to prevent acceleration in NBTS deterioration of the first circuit transistor TA, whereby reliability of the first circuit transistor TA is improved.

Hydrogen from at least one of the first and second inorganic encapsulation layers 142 and 146 and the multi-buffer layer 118 is spread into the second active layer 104 of the second circuit transistor TB and is bonded with excess oxygen in the second active layer 104. As a result, the amount of excess oxygen in the second active layer 104 is reduced, whereby defect state passivation is achieved and thus reliability of the second circuit transistor TB is improved.

Meanwhile, in FIG. 9, each of the first and second active layers 154 and 104 of the first and second circuit transistors TA and TB is constituted by an oxide semiconductor layer. Alternatively, one of the active layers 154 and 104 of the first and second circuit transistors TA and TB may be constituted by an oxide semiconductor layer, and the other of the active layers of the first and second circuit transistors TA and TB may be constituted by a polycrystalline semiconductor layer.

Figure 10:
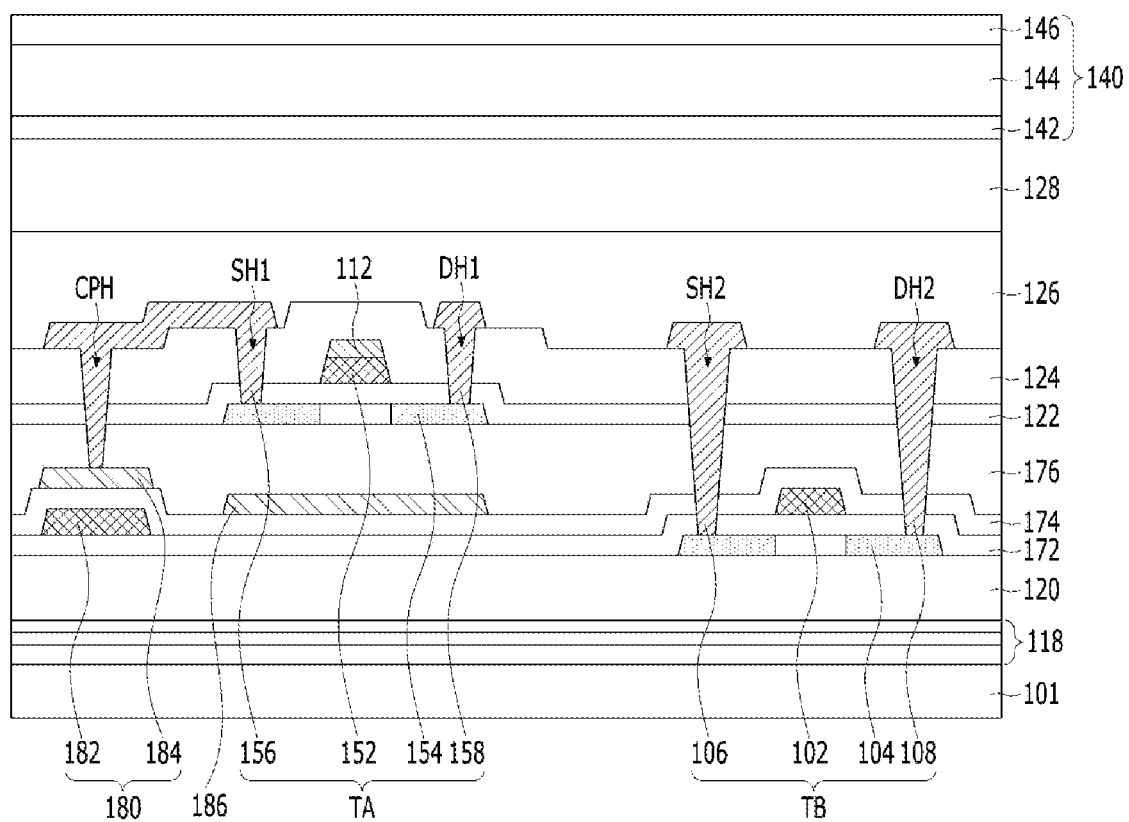
FIG. 10 is a sectional view of a second embodiment of the gate driving unit shown in FIG. 8.

A structure in which the first active layer 154 of the first circuit transistor TA is constituted by an oxide semiconductor layer and the second active layer 104 of the second circuit transistor TB is constituted by a polycrystalline semiconductor layer will be described by way of example with reference to FIG. 10.

The first active layer 154 of the first circuit transistor TA is disposed higher than the second active layer 104 of the second circuit transistor TB in order to prevent damage thereto in a process of manufacturing the second circuit transistor TB in a high-temperature environment.

To this end, the first active layer 154 of the first circuit transistor TA is formed on an upper buffer layer 176, and the second active layer 104 of the second circuit transistor TB is formed on a lower buffer layer 120. A second source electrode 106 of the second circuit transistor TB contacts the second active layer 104 exposed through a second source contact hole SH2 formed through a lower gate dielectric film 172, a lower interlayer dielectric film 174, the upper buffer layer 176, a gate dielectric film 122, and an interlayer dielectric film 124. A second drain electrode 108 of the second circuit transistor TB contacts the second active layer 104 exposed through a second drain contact hole DH2 formed through the lower gate dielectric film 172, the lower interlayer dielectric film 174, the upper buffer layer 176, the gate dielectric film 122, and the interlayer dielectric film 124.

A circuit capacitor 180 electrically connected to the first circuit transistor TA includes first and second capacitor electrodes 182 and 184 overlapping each other via the lower interlayer dielectric film 174.

The first capacitor electrode 182 is formed of the same material as the second gate electrode 102 of the second circuit transistor TB and is disposed in the same plane as the second gate electrode 102. That is, the first capacitor electrode 182 is disposed on the lower gate dielectric film 172.

The second capacitor electrode 184 is formed of the same material as a circuit shading layer 186 disposed under the first active layer 154 of the first circuit transistor TA and is disposed in the same plane as the circuit shading layer 186. That is, the second capacitor electrode 184 is disposed on the lower interlayer dielectric film 174. The second capacitor electrode 184 is exposed through a circuit contact hole CPH formed through the upper buffer layer 176, the gate dielectric film 122, and the interlayer dielectric film 124 so as to be electrically connected to a first source electrode 156 of the first circuit transistor TA.

In the case in which the second circuit transistor TB includes a second active layer 104 constituted by a polycrystalline semiconductor layer, as described above, each of switching and driving transistors TS and TD disposed at the subpixel SP is formed so as to have the same stack structure as a first circuit transistor TA including a first active layer 154 constituted by an oxide semiconductor layer.

Figure 11:
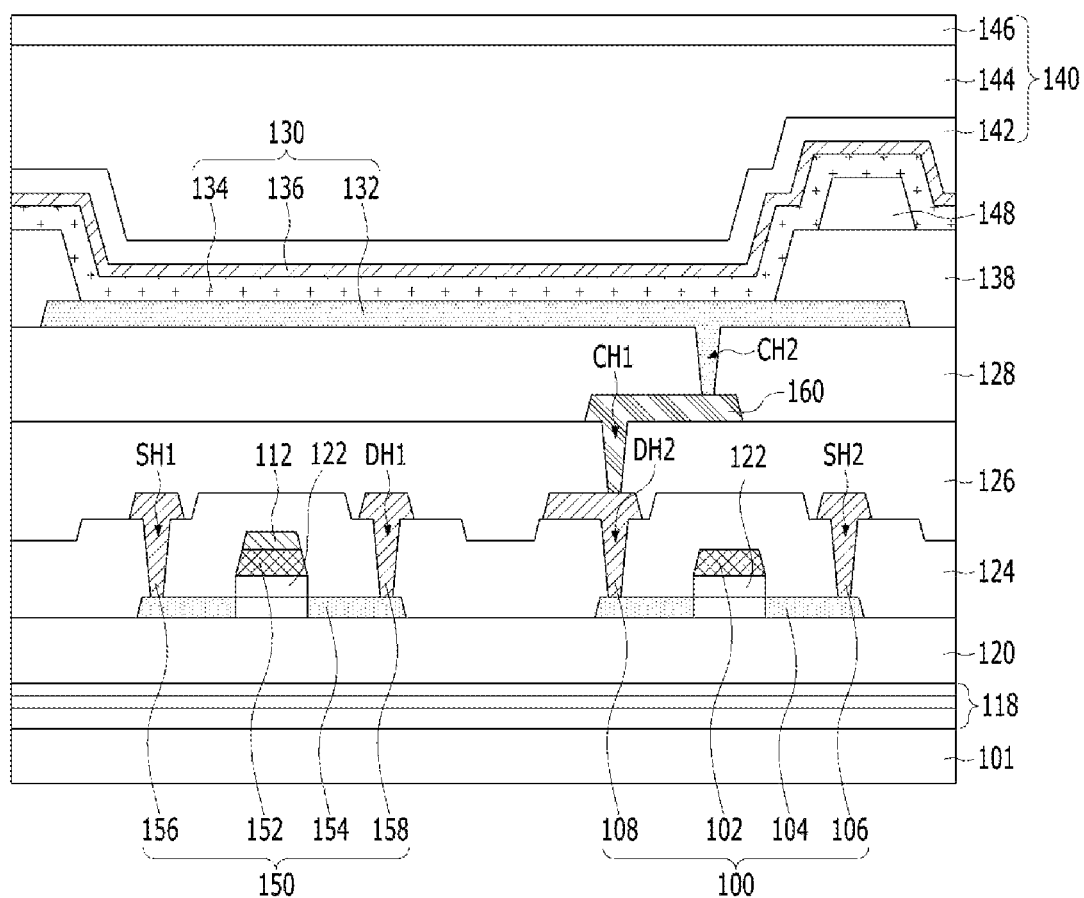
FIG. 11 is a sectional view of another embodiment of a gate dielectric film of the display device according to the present invention.

Meanwhile, although the case in which the gate dielectric film 122 is disposed in a conductorization region and a channel region of each of the active layers 154 and 104 has been described by way of example in the present invention, the gate dielectric film 122 may be disposed in only the channel region of each of the active layers 154 and 104, as shown in FIG. 11.

Specifically, the gate dielectric film 122 shown in FIG. 11 is disposed on the channel region of each of the active layers 154 and 104, and the interlayer dielectric film 124 is disposed in the conductorization region of each of the active layers 154 and 104. In this case, the source and drain electrodes 156, 106, 158, and 108 contact the conductorization regions of the active layers 154 and 104 exposed through the source and drain contact holes SH1, DH1, SH2, and DH2 formed through the interlayer dielectric film 124.

In addition, the gate dielectric film 122 shown in FIG. 11 is formed together with the gate electrodes 152 and 102 through the same mask process as the gate electrodes 152 and 102. Consequently, the gate dielectric film 122 shown in FIG. 11 is formed between the gate electrodes 152 and 102 and the channel regions of the active layers 154 and 104 so as to have a line width equal or similar to the line width of each of the gate electrodes 152 and 102.

Figure 12A:
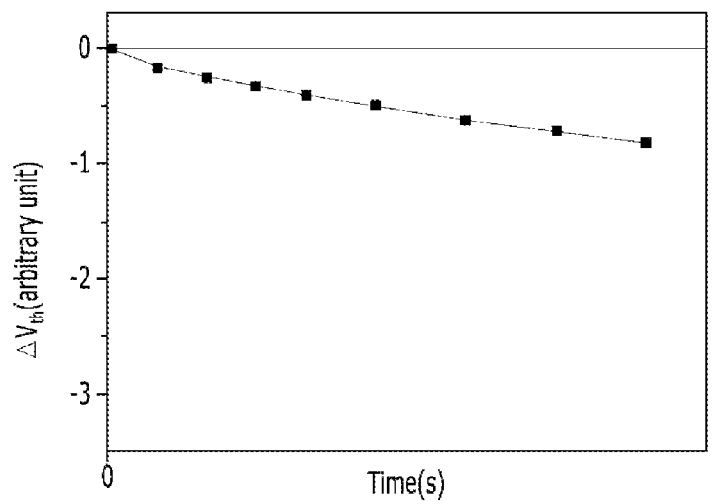
FIG. 12A is a view illustrating negative bias temperature stress (NBTS) properties of a switching transistor according to a comparative example having no barrier conductive layers.
Figure 12B:
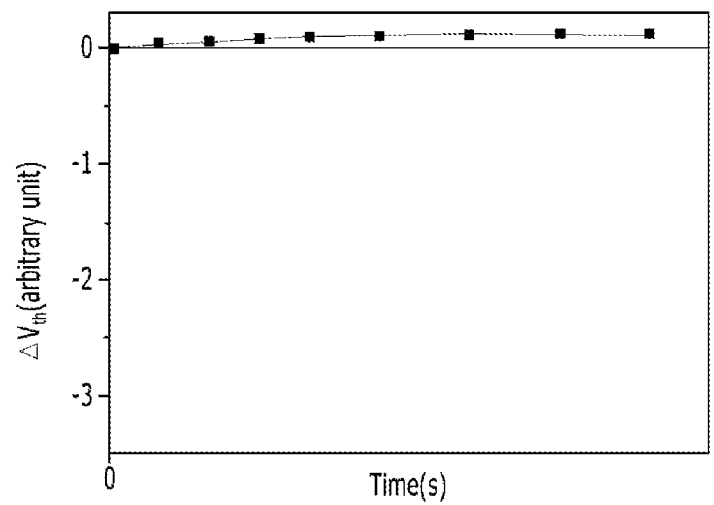
FIG. 12B is a view illustrating negative bias temperature stress (NBTS) properties of a switching transistor according to an example having barrier conductive layers.

FIG. 12A is a view illustrating the electrical properties of a switching transistor according to a comparative example having no barrier conductive layers, and FIG. 12B is a view illustrating the electrical properties of a switching transistor according to an example having barrier conductive layers.

As shown in FIG. 12A, it can be seen that threshold voltage of the switching transistor TS according to the comparative example having no barrier conductive layers 112, 114, and 116 is greatly shifted in a negative direction over time, wherein the vertical axis represents amount of change of the threshold voltage Δth.

In contrast, as shown in FIG. 12B, it can be seen that threshold voltage of the switching transistor TS according to the example having barrier conductive layers 112, 114, and 116 is slightly shifted over time, compared to the switching transistor TS according to the comparative example. Consequently, it can be seen that, in the case in which the barrier conductive layers 112, 114, and 116 are provided, reliability of the switching transistor TS, in which NBTS is accumulated, is improved, compared to the case in which no barrier conductive layers 112, 114, and 116 are provided.

Figure 13A:
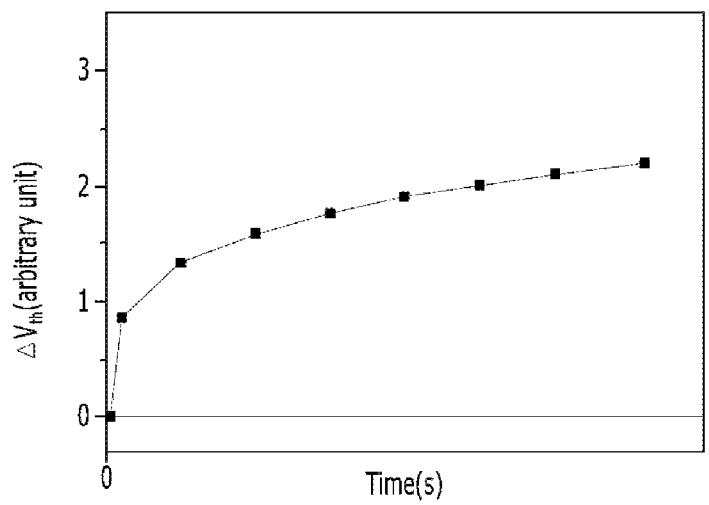
FIG. 13A is a view illustrating positive bias temperature stress (PBTS) properties of a driving transistor according to a comparative example having barrier conductive layers.
Figure 13B:
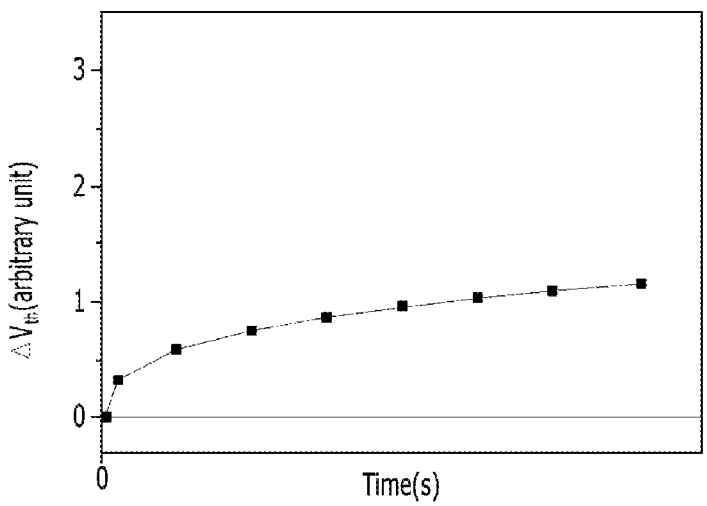
FIG. 13B is a view illustrating PBTS properties of a driving transistor according to an example having no barrier conductive layers.

FIG. 13A is a view illustrating the electrical properties of a driving transistor according to a comparative example having barrier conductive layers, and FIG. 13B is a view illustrating the electrical properties of a driving transistor according to an example having no barrier conductive layers.

As shown in FIG. 13A, it can be seen that threshold voltage of the driving transistor TD according to the comparative example having barrier conductive layers 112, 114, and 116 is greatly shifted in a positive direction over time.

In contrast, as shown in FIG. 13B, it can be seen that threshold voltage of the driving transistor TD according to the example having no barrier conductive layers 112, 114, and 116 is slightly shifted over time, compared to the driving transistor TD according to the comparative example. Consequently, it can be seen that, in the case in which no barrier conductive layers 112, 114, and 116 are provided, reliability of the driving transistor TD, in which PBTS is accumulated, is improved, compared to the case in which the barrier conductive layers 112, 114, and 116 are provided.

Meanwhile, the present invention is applicable to an electronic device including a transistor, although the organic light-emitting display device has been described by way of example in the present invention.

As is apparent from the above description, a display device according to the present invention includes a barrier conductive layer configured to overlap an active layer of a first transistor, the electrical property of which is shifted from an initial value in a decreasing direction. Consequently, the concentration of hydrogen in the vicinity of the first transistor is reduced by the barrier conductive layer, whereby it is possible to prevent carrier concentration of a channel of the first transistor from being increased by hydrogen. As a result, it is possible to prevent acceleration in deterioration of the first transistor, whereby reliability of the first transistor is improved.

In addition, the barrier conductive layer according to the present invention does not overlap an active layer of a second transistor, the electrical property of which is shifted from an initial value in an increasing direction. Consequently, concentration of hydrogen in the vicinity of the second transistor is not changed. As a result, hydrogen is bonded with excess oxygen in the active layer of the second transistor, whereby defect state passivation is achieved and thus reliability of the second transistor is improved.

As described above, in the present invention, a trade-off between the first and second transistors having different properties in bonding with hydrogen is overcome, whereby reliability of each of the first and second transistors is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
   a first transistor disposed on a substrate, an electrical property of the first transistor being shifted from a first initial value in a decreasing direction;
   a second transistor disposed on the substrate, an electrical property of the second transistor being shifted from a second initial value in an increasing direction; and
   a first upper barrier conductive layer disposed directly on a first gate electrode of the first transistor so as to overlap a first active layer of the first transistor and not to overlap a second active layer of the second transistor.

2. The display device according to claim 1, wherein
   the first transistor comprises the first gate electrode configured to overlap the first active layer, and
   the first upper barrier conductive layer is disposed directly on the first gate electrode so as to expose a side surface of the first gate electrode.

3. The display device according to claim 2, wherein the second transistor comprises a second gate electrode configured to overlap the second active layer, the second gate electrode being formed of a same material as the first gate electrode.

4. The display device according to claim 3, wherein
   the first upper barrier conductive layer is formed so as to have a single-layered or multilayered structure using a hydride forming metal comprising at least one of Ti and Zr, and
   each of the first and second gate electrodes is formed so as to have a single-layered or multilayered structure using a non-hydride forming metal comprising at least one of Mo, Cu, Al, and W.

5. The display device according to claim 3, further comprising:
   a first shading layer disposed between the first active layer of the first transistor and the substrate;
   a second shading layer disposed between the second active layer of the second transistor and the substrate; and
   a lower barrier conductive layer disposed between the first shading layer and the first active layer so as to overlap the first shading layer and not to overlap the second shading layer.

6. The display device according to claim 5, wherein
the lower barrier conductive layer is formed so as to have a single-layered or multilayered structure using a hydride forming metal comprising at least one of Ti and Zr, and
each of the first shading layer and the second shading layer is formed so as to have a single-layered or multilayered structure using a non-hydride forming metal comprising at least one of Mo, Cu, Al, and W.

7. The display device according to claim 3, further comprising:
a storage electrode configured to overlap the second gate electrode via a storage dielectric film so as to form a storage capacitor;
an interlayer conductive layer configured to overlap the first gate electrode via the storage dielectric film; and
a second upper barrier conductive layer disposed on the interlayer conductive layer so as to overlap the interlayer conductive layer and not to overlap the storage electrode.

8. The display device according to claim 7, wherein the interlayer conductive layer is maintained in a floating state.

9. The display device according to claim 7, wherein
the second upper barrier conductive layer is formed so as to have a single-layered or multilayered structure using a hydride forming metal comprising at least one of Ti and Zr, and
each of the interlayer conductive layer and the storage electrode is formed so as to have a single-layered or multilayered structure using a non-hydride forming metal comprising at least one of Mo, Cu, Al, and W.

10. The display device according to claim 1, further comprising a light-emitting device configured to contact one of the first and second transistors.

11. The display device according to claim 1, further comprising a gate driving unit comprising at least one of the first transistor and the second transistor.

12. A display device comprising:
a switching transistor disposed on a substrate, the switching transistor comprising a first gate electrode and a first active layer formed of an oxide semiconductor layer;
a driving transistor electrically connected to the switching transistor, the driving transistor comprising a second active layer formed of a same material as the first active layer;
a light-emitting device electrically connected to the driving transistor; and
a first upper barrier conductive layer disposed directly on the first gate electrode so as to overlap the first active layer of the switching transistor and not to overlap the second active layer of the driving transistor.

13. The display device according to claim 12, wherein
the first gate electrode is configured to overlap the first active layer, and
the first upper barrier conductive layer is disposed directly on the first gate electrode so as to expose a side surface of the first gate electrode.

14. The display device according to claim 13, wherein the driving transistor comprises a second gate electrode configured to overlap the second active layer, the second gate electrode being formed of a same material as the first gate electrode.

15. The display device according to claim 14, wherein
the first upper barrier conductive layer is formed so as to have a single-layered or multilayered structure using a hydride forming metal comprising at least one of Ti and Zr, and
each of the first gate electrode and the second gate electrode is formed so as to have a single-layered or multilayered structure using a non-hydride forming metal comprising at least one of Mo, Cu, Al, and W.

16. The display device according to claim 14, further comprising:
a first shading layer disposed between the first active layer of the switching transistor and the substrate;
a second shading layer disposed between the second active layer of the driving transistor and the substrate; and
a lower barrier conductive layer disposed between the first shading layer and the first active layer so as to overlap the first shading layer and not to overlap the second shading layer.

17. The display device according to claim 16, wherein
the lower barrier conductive layer is formed so as to have a single-layered or multilayered structure using a hydride forming metal comprising at least one of Ti and Zr, and
each of the first shading layer and the second shading layer is formed so as to have a single-layered or multilayered structure using a non-hydride forming metal comprising at least one of Mo, Cu, Al, and W.

18. The display device according to claim 14, further comprising:
a storage electrode configured to overlap the second gate electrode via a storage dielectric film so as to form a storage capacitor;
an interlayer conductive layer configured to overlap the first gate electrode via the storage dielectric film; and
a second upper barrier conductive layer disposed on the interlayer conductive layer so as to overlap the interlayer conductive layer and not to overlap the storage electrode.

19. The display device according to claim 18, wherein the interlayer conductive layer is maintained in a floating state.

20. The display device according to claim 18, wherein
the second upper barrier conductive layer is formed so as to have a single-layered or multilayered structure using a hydride forming metal comprising at least one of Ti and Zr, and
each of the interlayer conductive layer and the storage electrode is formed so as to have a single-layered or multilayered structure using a non-hydride forming metal comprising at least one of Mo, Cu, Al, and W.

21. The display device according to claim 12, further comprising:
a gate line connected to the switching transistor, wherein the first upper barrier conductive layer is disposed on a gate line disposed in a vicinity of the switching transistor excluding a vicinity of the driving transistor.

* * * * *